United States Patent [19]

Ewen et al.

[11] Patent Number: 5,440,277
[45] Date of Patent: Aug. 8, 1995

[54] VCO BIAS CIRCUIT WITH LOW SUPPLY AND TEMPERATURE SENSITIVITY

[75] Inventors: John F. Ewen; Mehmet Soyuer, both of Yorktown Heights, N.Y.

[73] Assignee: International Business Machines Corporation, Armonk, N.Y.

[21] Appl. No.: 300,505

[22] Filed: Sep. 2, 1994

[51] Int. Cl.⁶ .............. H03B 5/04; H03B 5/24; H03K 3/011; H03L 1/00
[52] U.S. Cl. ................. 331/176; 331/57; 331/186; 327/538; 327/543
[58] Field of Search .......... 331/34, 57, 65, 66, 331/108 R, 109, 116 R, 116 FE, 117 R, 117 FE, 117 D, 175, 176, 177 R, 182, 183, 185, 186; 327/262, 513, 538-543

[56] References Cited

U.S. PATENT DOCUMENTS

| | | | |
|---|---|---|---|
| 4,853,654 | 8/1989 | Sakurai | 331/176 X |
| 4,978,930 | 12/1990 | Suter | 331/176 |
| 5,072,197 | 12/1991 | Anderson | 331/176 X |
| 5,175,512 | 12/1992 | Self | 331/186 X |
| 5,180,995 | 1/1993 | Hayashi et al. | 331/176 X |
| 5,291,071 | 3/1994 | Allen et al. | 327/513 X |

OTHER PUBLICATIONS

P. Gray et al, "Analysis & Design Of Analog Integrated Circuits", John Wiley & Sons, Inc., 1977, pp. 322-331.
Ian A. Young et al, "A PLL Clock Generator with 5 TO 110 MHz of Lock Range for Microprocessors", IEEE Journal of Solid State Circuits, vol. 27, No. 11, Nov. 1992, pp. 1599-1607.
Eric A. Vittoz et al, "A Low-Voltage CMOS Bandgap Reference", IEEE Journal of Solid State Circuits, vol. SC-14, No. 3, Jun. 1979, pp. 573-577.
S. K. Enam et al, "NMOS IC's for Clock and Data Regeneration in Gigabit-per-Second Optical-Fiber Receivers", IEEE Journal of Solid State Circuits, vol. 27, No. 12, Dec. 1992, pp. 1763-1774.
J. G. Maneatis et al, "Precise Delay Generation Using Coupled Oscillators", ISSCC 93/Analog Techniques/-Paper TA 7.5, Feb. '93, Digest Of Technical Papers, pp. 118-119.

*Primary Examiner*—David Mis
*Attorney, Agent, or Firm*—Robert P. Tassinari, Jr.

[57] ABSTRACT

A novel bias generator circuit for a voltage controlled oscillator is described. The bias generator allows the VCO frequency to be made essentially independent of the supply voltage and temperature.

4 Claims, 3 Drawing Sheets

VCO BIAS CIRCUIT WITH LOW SUPPLY AND TEMPERATURE SENSITIVITY

FIELD OF THE INVENTION

The invention relates to voltage controlled oscillators (VCOs), and in particular to a biasing circuit for VCOs.

BACKGROUND OF THE INVENTION

Clock generation and clock recovery circuits typically use voltage-controlled oscillators (VCO's) within a phase lock loop (PLL) to either generate a clock from an external reference or from an incoming data stream. The overall performance of these circuits depends critically on the VCO, and excellent power supply rejection is a key requirement. This is especially important when the VCO is to be integrated onto a CMOS chip, such as a microprocessor, because CMOS logic generates large amounts of power supply noise when switching.

The usual measure of the VCO supply sensitivity is the frequency deviation per volt of power supply variation, relative to the VCO center frequency (% deviation/V). Previous work describes VCO and associated bias circuits which attain 0.7%/V supply sensitivity for a clock generation circuit, I. A. Young et al., "A PLL Clock Generator with 5 to 110 MHz of Lock Range for Microprocessors", IEEE J. Solid State Circuits, vol. 27, no. 11, pp. 1599–1607, although the temperature sensitivity is poor (4700 ppm/C) (where ppm is parts per million). Also known is a precision delay generator which can achieve only a 0.3%/V supply sensitivity, J. G. Manearis, et al., "Precise Delay Generation Using Coupled Oscillators", ISSCC 1993 Digest of Technical Papers, pp. 118–19, February 1993.

The present invention provides a bias generator scheme which allows for excellent power supply rejection, $\leq 0.1\%/V$, while maintaining very good temperature sensitivity, <50 ppm/C.

SUMMARY OF THE INVENTION

The present invention provides a biasing circuit which can be used, for example, to provide a bias signal for a voltage controlled oscillator. The bias circuit of the present invention is advantageous because it renders the VCO output frequency essentially independent of temperature effects and input voltage fluctuations. The bias circuit includes means for generating a first bias current with a first temperature coefficient and a first supply coefficient of frequency, means for generating a second bias current with a second temperature coefficient and a second supply coefficient of frequency, and means for generating a third current with a third supply coefficient and third temperature coefficient of frequency. Also provided are means for summing the first, second and third bias currents to yield an output bias signal having a desired temperature coefficient and supply coefficient of frequency.

FIGURES

DETAILED DESCRIPTION

The present invention uses multiple bias generators, some with positive gradients with respect to power supply and temperature, and some with negative gradients with respect to power supply and temperature, to provide ring VCO bias inputs. The outputs of the individual generators are summed together, with appropriate weighing coefficients, such that the resulting sensitivity to power supply and temperature variations can be made arbitrarily small. These gradients are measured relative to the VCO frequency rather than a specific voltage or current. In this way the key VCO parameter is made insensitive to supply and temperature.

FIGS. 1 through 6 are used to describe a preferred embodiment of this invention. These figures are not intended, and should not be interpreted to limit the scope of the invention to the particular form of reference generator circuits depicted. The figures are arranged so that key features of the invention will be described separately, followed by a discussion of a preferred embodiment of the invention as a whole.

1. Voltage Controlled Oscillator

Figure 1:
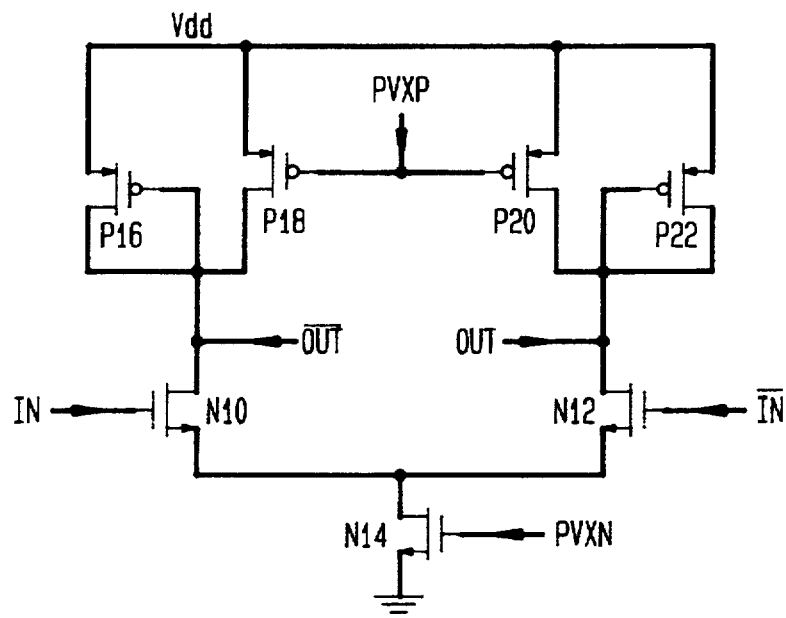
FIG. 1 is a prior art ring oscillator delay stage circuit.

For illustrative purposes, consider a voltage controlled ring oscillator (FIG. 5), where a plurality of the differential circuits shown in FIG. 1 comprise the individual delay buffers in the ring. The switching circuit of FIG. 1 is formed by a differential NMOS transistor pair, N10 and N12, with true and complement inputs, IN and $\overline{\text{IN}}$, respectively. When node IN is at a greater potential than node $\overline{\text{IN}}$, the current provided by the tail current source, N14, is steered to the load devices P16 and P18, forcing the output $\overline{\text{OUT}}$ to a lower potential than output OUT. When node $\overline{\text{IN}}$ is greater than node IN, the current is steered to the load devices P20 and P22, forcing node OUT to a lower potential than $\overline{\text{OUT}}$. The magnitude of the switching current is determined by the bias voltage, PVXN, at the gate of N14.

Figure 5:
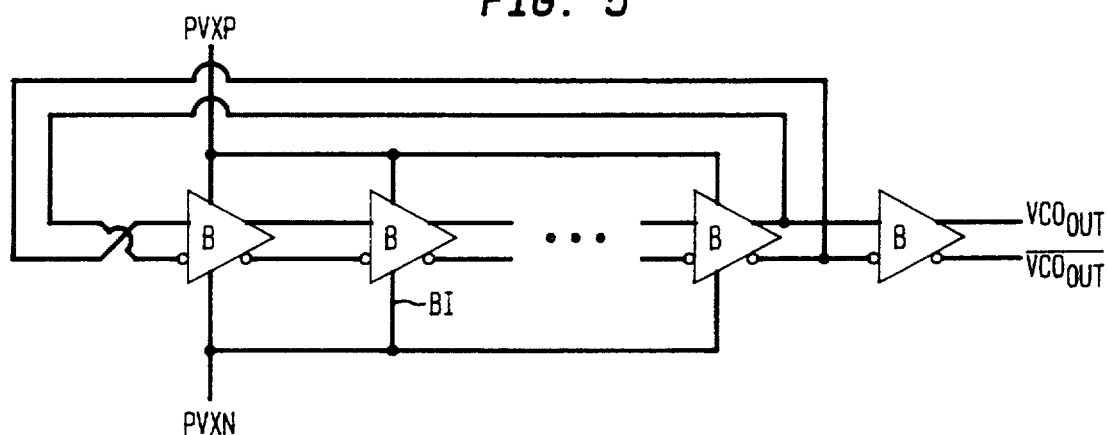
FIG. 5 is a preferred ring oscillator comprising a plurality of the delay stage circuits of FIG. 1.

In a similar manner, the effective impedance of the load devices, P16–P22, is determined by the gate bias PVXP. By increasing the potential at PVXN, while simultaneously decreasing the potential on PVXP, the switch current increases while the voltage swing at the output remains essentially constant. In this way, the delay of the circuit can be varied over a wide range, while maintaining a constant signal swing throughout the VCO. A plurality of delay buffers can be configured to form a ring VCO as shown in FIG. 5. Each delay buffer B corresponds to a delay buffer like the one shown in FIG. 1.

The preferred ring oscillator is a differential-type oscillator, each delay stage having both true and complementary inputs and outputs. The delay stages also each have a bias input BI. The bias voltage circuit of the present invention provides a bias input which renders the delay buffer essentially independent of temperature and supply voltage variations.

Figure 6:
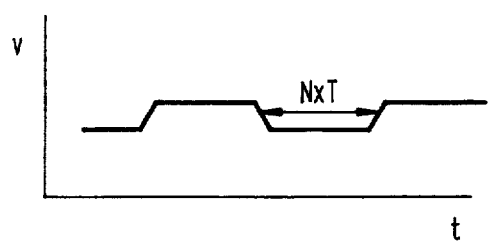
FIG. 6 is a waveform plot of the output of the ring VCO of FIG. 5.

The VCO also has a pair of outputs $VCO_{out}$ and $\overline{VCO}_{out}$. The waveform for these outputs is shown in FIG. 6. The period of the waveform is $N*T*2$, where N represents the number of delay buffers and T represents the delay introduced by each buffer.

2. $V_t$ Reference Generator

Figure 2:
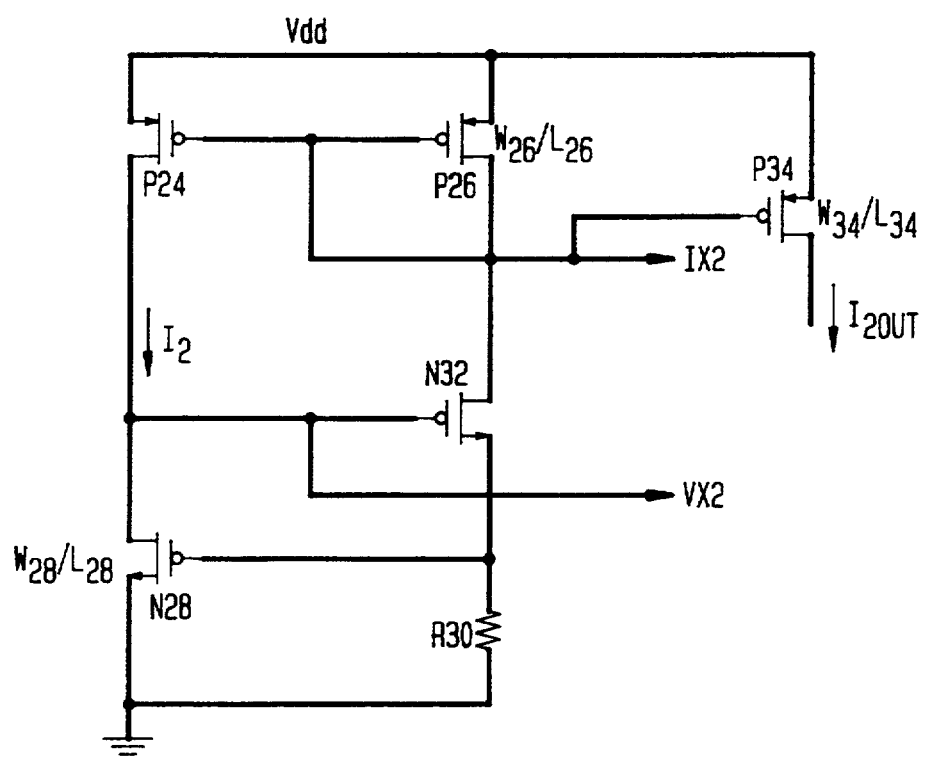
FIG. 2 is a reference generator circuit according to the invention.

A $V_t$ reference generator used in a preferred embodiment of the invention is shown in FIG. 2. This is a CMOS voltage reference circuit comprising PMOS devices P24 and P26 connected to form a current mirror such that the drain current in P24, I2, is equal to the drain current in P26 as well as the source current in N28 and resistor R30. NMOS device N32 provides negative feedback to stabilize the operating point of the circuit.

The voltage developed across resistor R30 is equal to the gate-source voltage of NMOS device N28. The current in the resistor is thus given by:

$$I_{R30} = \frac{1}{R30}\left(V_{t28} + \sqrt{\frac{2I_{R30}}{\mu_n C_{ox}(W_{28}/L_{28})}}\right)$$

$V_{t28}$ is the threshold voltage of N28, $\mu_n$ is the mobility, and $C_{ox}$ is the gate oxide capacitance for NMOS device N28. For large $W_{26}/L_{26}$ of N28, the current is equivalent to the threshold voltage of N28 divided by R30. The current is essentially independent of the power supply voltage, but has a strong negative temperature coefficient due to the negative dependence of $V_{t28}$ on temperature, and the positive temperature coefficient of resistor R30. The output node, IX, can be used to generate a desired output current by using PMOS device P34 as a current mirror. $I_{2out}$ is related to the reference current $I_2$ by the ratio of the device widths: $(W_{34}/L_{34})/(W_{28}/L_{28})$. The output VX2 provides a voltage output which is essentially independent of the power supply voltage and with a negative temperature coefficient.

3. PTAT Reference Generator

Figure 3:
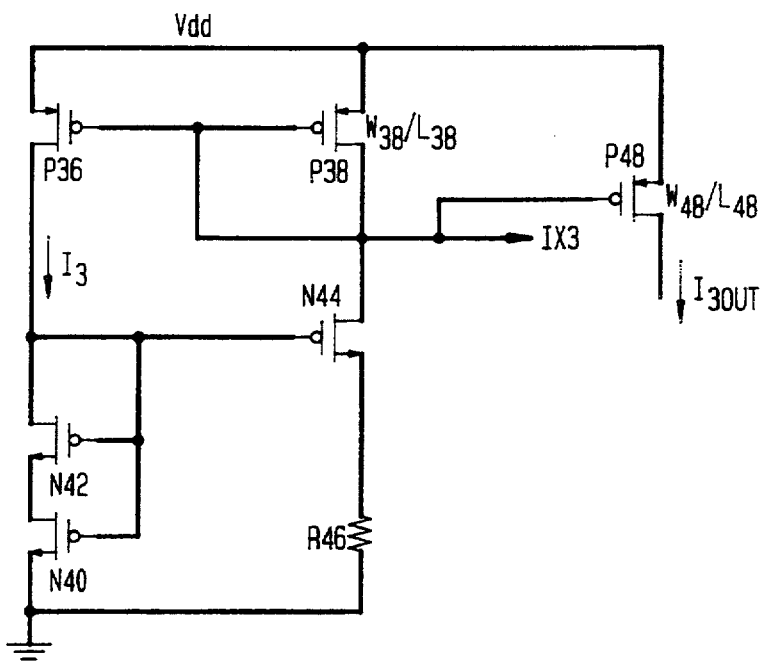
FIG. 3 is a PTAT reference generator circuit in accordance with the invention.

A PTAT (Proportional To Absolute Temperature) reference generator used in a preferred embodiment of the invention is shown in FIG. 3. PMOS devices P36 and P38 form a current mirror, such that the current, $I_3$, in P36 is equal to the drain current in P38. N40 and N42 are connected in series, with N42 operating in saturation and N40 operating in the linear region, to increase the magnitude of the temperature coefficient. N44 forces the voltage across R46 to be equal to the gate-source voltage across N40 minus one threshold voltage. The resulting current is proportional to $1/KR^2$, where R is the resistance of R46, and K is the transconductance parameter of the NMOS devices. R46 will have a positive temperature coefficient, while K has a negative temperature coefficient. For reasonable parameter values found in typical CMOS processes, the resulting temperature coefficient for I3 is positive over a wide range of temperatures. The output node, IX3, can be used to generate the appropriate output current by using PMOS device P48 as a current mirror. $I_{3out}$ is related to the reference current $I_3$ by the ratio of the device widths: $(W_{48}/L_{48})/(W_{38}/L_{38})$. The supply voltage coefficient of $I_3$ is positive.

4. Supply and Temperature Compensated Bias Generator

Figure 4:
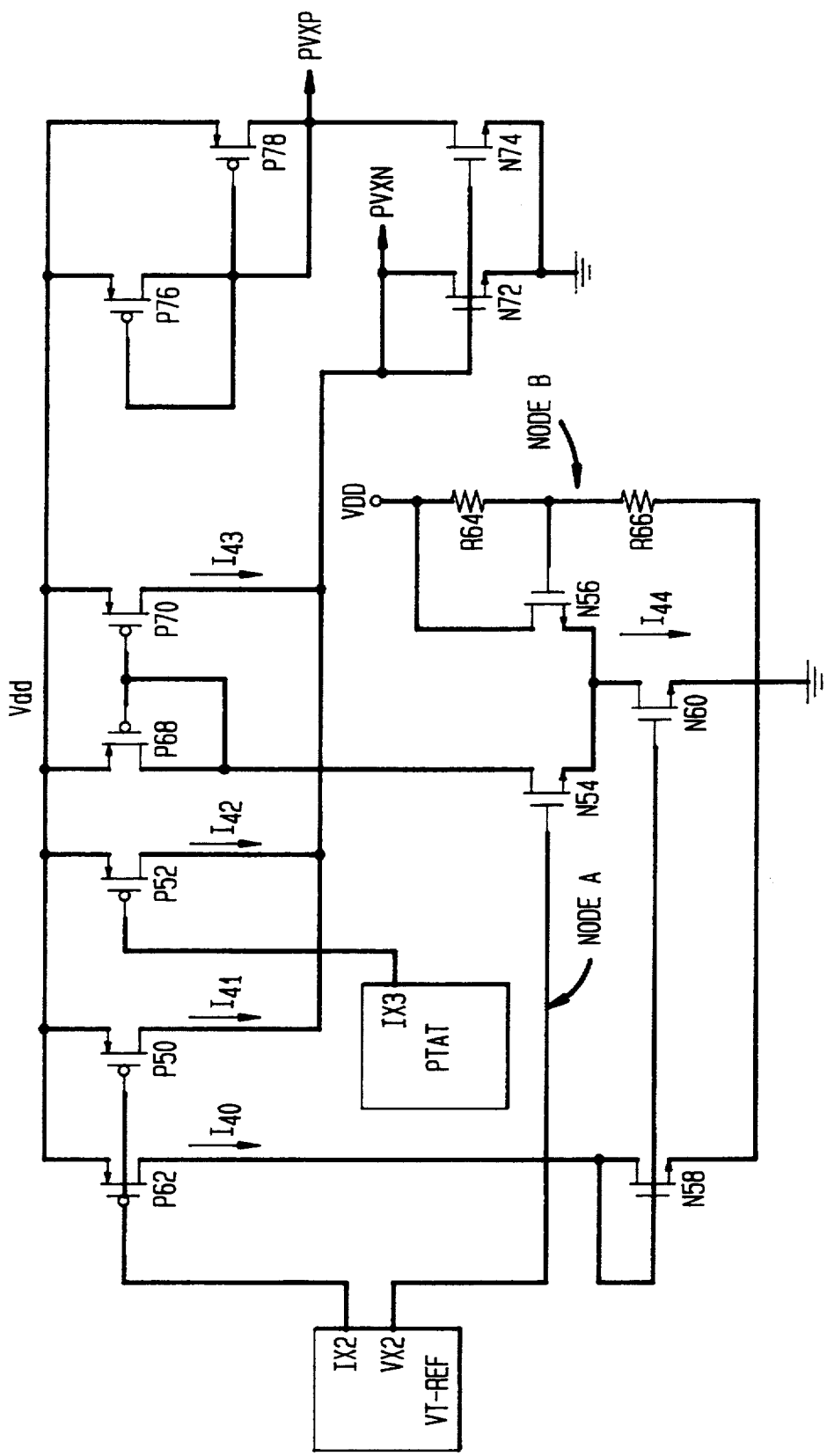
FIG. 4 depicts the VCO reference generator of the present invention.

A complete supply and temperature invariant bias generator in accordance with the invention is shown in FIG. 4. The blocks labeled $V_t$ Ref and PTAT refer to the circuits shown in FIGS. 2 and 3, respectively. P34 of FIG. 2 corresponds to P50 of FIG. 4, and P48 of FIG. 3 corresponds to P52 of FIG. 4. As discussed above, $V_t$ Ref provides a negative temperature coefficient, and PTAT provides a positive temperature coefficient. Both circuits, however, generate small positive supply coefficients. The circuit comprising N54–N60, P62, R64 and R66 generates a bias current with a negative supply coefficient, as now described.

The IX2 output of $V_t$ Ref is used to generate the basis current, as described previously, and in this circuit labelled $I_{40}$. Current $I_{40}$ is mirrored by NMOS devices N58 and N60 to bias the differential pair, N54 and N56.

The gate of N54 is connected to the VX output of $V_t$ Ref, and, as explained previously, this node is essentially independent of the supply voltage. R64 and R66 form a voltage divider which biases the gate of N56 and acts to sense the power supply voltage $V_{dd}$. As the supply voltage increases, node B rises, while node A remains constant. This causes the drain current of N56 of the differential pair to increase, while the drain current of N54 decreases correspondingly (because current $I_{44}$ is constant). The drain current of N54, therefore, exhibits a negative supply coefficient. This drain current of N54 current is mirrored in PMOS devices P68 and P70 to generate the bias current I43, which will also exhibit a negative supply coefficient and a negative temperature coefficient.

Therefore, three bias currents are generated: $I_{41}$, which reflects the positive supply coefficient and negative temperature coefficient of frequency of the $V_t$ Ref circuit; $I_{42}$, which reflects the positive supply coefficient and positive temperature coefficient of the PTAT circuit; and $I_{43}$, which has a negative supply coefficient and negative temperature coefficient to reflect the characteristics of the circuit comprising N54–N60, P62, R64 and R66. These three currents are summed together in the NMOS current mirror provided by devices N72 and N74. The gate bias of N72 is used to generate the required bias voltage, PVXN, for the NMOS current source of the VCO delay stage in FIG. 1. Finally, PMOS devices P76 and P78, which preferably are identical to the PMOS load devices (P16 and P22, FIG. 1) found in the VCO delay stage, are used to generate the load bias voltage, PVXP, in the VCO delay stage.

The relative weighing of I41, I42, and I43 can be adjusted by varying the relative sizes of PMOS devices P50, P52 and P70, respectively. These device sizes are adjusted until both the temperature coefficient and the supply coefficient of the VCO frequency are made as small as required.

While the invention has been described particularly with respect to a preferred embodiment thereof, those skilled in the art will recognize that changes and departures from the disclosed embodiment can be made without departing from the spirit and scope of the invention.

For instance, the use of the bias circuit of the present invention is not limited to the particular type of VCO described. Also, the described invention has equal applicability to bipolar transistor technology.

We claim:

1. A biasing circuit, comprising:
    means for generating a first bias current with a first temperature coefficient and a first supply coefficient of delay;
    means for generating a second bias current with a second temperature coefficient and a second supply coefficient of delay;

means for generating a third current with a third supply coefficient and third temperature coefficient of delay;

means for summing the first, second and third bias currents to yield an output bias signal having a desired temperature coefficient and supply coefficient of delay.

2. The circuit of claim 1, further comprising:

means for adjusting the relative contributions of the first, second and third bias currents to the output bias current and voltage.

3. The circuit of claim 1, further comprising means for adjusting the supply coefficient of delay and temperature coefficient of each of the current generating means.

4. A circuit for creating power supply and temperature insensitive biasing of a voltage controlled oscillator (VCO) frequency comprising:

a first current reference circuit whose output current is defined by an NMOS threshold voltage, $V_{th}$, and a first resistor, the fist current reference circuit exhibiting a positive supply voltage coefficient and negative temperature coefficient;

a second current reference circuit whose output current is defined by an NMOS transconductance, K, and a second resistor, the second current reference circuit exhibiting a positive supply coefficient and positive temperature coefficient;

a third current reference circuit comprising a differential pair of transistors, with the gate of one of the transistors biased at a constant voltage, and the gate of the other of the transistors connected to a resistive divider which senses power supply voltage, such that the output current of the one transistor of the differential pair exhibits a negative supply coefficient and a negative temperature coefficient;

means for summing of the currents produced by the first, second and third reference circuits to produce an output bias signal;

means for setting the relative contributions of the supply and temperature coefficients of the currents produced by the first, second and third reference circuits to enable the VCO frequency to be essentially independent of the supply voltage and temperature.

* * * * *